United States Patent
Kubis et al.

(10) Patent No.: US 10,763,367 B2
(45) Date of Patent: Sep. 1, 2020

(54) CASCADE TUNNELING FIELD EFFECT TRANSISTORS

(71) Applicant: Purdue Research Foundation, West Lafayette, IN (US)

(72) Inventors: Tillmann C. Kubis, West Lafayette, IN (US); Prasad Sarangapani, Mountain View, CA (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/407,771

(22) Filed: May 9, 2019

(65) Prior Publication Data

US 2019/0348536 A1    Nov. 14, 2019

Related U.S. Application Data

(60) Provisional application No. 62/668,991, filed on May 9, 2018.

(51) Int. Cl.
| | | |
|---|---|---|
| *H01L 29/15* | (2006.01) | |
| *H01L 29/78* | (2006.01) | |
| *H01L 29/66* | (2006.01) | |

(52) U.S. Cl.
CPC ........ *H01L 29/7855* (2013.01); *H01L 29/154* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 2015/0179800 A1* | 6/2015 | Biswas | ............... H01L 29/7855 365/189.011 |
| 2015/0340489 A1 | 11/2015 | Xiao | |
| 2019/0378919 A1* | 12/2019 | Kubis | ................... H01L 29/165 |

OTHER PUBLICATIONS

Kim, N. S. et al., Leakage Current: Moore's Law Meets Static Power, Computer 36, 2003, pp. 68-75.
Kao, J. et al., Subthreshold Leakage Modeling and Reduction Techniques [IC CAD tools], in IEEE/ACM International Conference on Computer Aided Design, ICCAD 2002, pp. 141-148. doi:10.1109/ICCAD.2002.1167526.
Ionescu, A. M. et al., Tunnel Field-effect Transistors as Energy-efficient Electronic Switches, Nature 479, 2011, pp. 329.
Appenzeller, J. et al., Band-to-Band Tunneling in Carbon Nanotube Field-Effect Transistors. Phys. Rev. Letters 93, 2004, 196805.
(Continued)

*Primary Examiner* — Benjamin P Sandvik
(74) *Attorney, Agent, or Firm* — Maginot, Moore & Beck LLP

(57) ABSTRACT

A tunnel field-effect transistor (TFET) includes a fin, an insulator layer, and at least one gate. The fin has a doped first region, a doped second region, and an interior region between the first region and the second region. The interior region is undoped or is more lightly doped than the first region and the second region. At least the interior region of the fin formed as a type II superlattice, wherein materials of the superlattice alternate vertically. The insulator layer is formed around the interior region. The gate is formed on at least a portion of the insulator region. The insulator layer and the at least one gate are configured to generate an inhomogeneous electrostatic potential within the interior region.

20 Claims, 4 Drawing Sheets

(56) References Cited

OTHER PUBLICATIONS

Appenzeller, J. et al., Comparing Carbon Nanotube Transistors—the ideal choice: a novel tunneling device design, IEEE Trans. Electron Devices, 2005, pp. 2568-2576, 52.
Seabaugh, A. C. et al., Low-Voltage Tunnel Transistors for Beyond CMOS Logic, Proc. IEEE 98, 2010, pp. 2095-2110.
Lu, H. et al., Tunnel Field-Effect Transistors: State-of-the-Art, IEEE J. Electron Devices Soc. 2, 2014, pp. 44-49.
Teherani, J. T. et al., Auger Generation as an Intrinsic Limit to Tunneling Field-effect Transistor Performance, J. Appl. Phys. 120, 2016, 084507.
Jirauschek, C. et al., Modeling Techniques for Quantum Cascade Lasers, Appl. Phys. Rev. 1, 2014.
Wang, K-C. et al., Control of Interlayer Physics in 2H Transition Metal Dichalcogenides, J. Appl. Phys. 122, 2017, 224302.
Bai, Y., et al., Quantum cascade lasers that emit more light than heat, Nat. Photonics 4, 2010, pp. 99.
Zhang, K. et al., Interlayer Transition and Infrared Photodetection in Atomically Thin Type-II MoTe2/MoS2 van der Waals Heterostructures. ACS Nano 10, 2016, pp. 3852-3858.

\* cited by examiner

CASCADE TUNNELING FIELD EFFECT TRANSISTORS

This application claims the benefit of U.S. provisional patent application Ser. No. 62/668,991, filed May 9, 2018, the entirety of which is incorporated herein by reference.

FIELD

The present invention relates generally to semiconductor devices, and more particularly, to field effect transistors.

BACKGROUND

The Metal-Oxide-Semiconductor Field-Effect Transistor (MOSFET) is by far the most common transistor in digital circuits. Because billions of MOSFETs can be included in a memory chip or microprocessor, developments of MOSFET technology often involve the reduction in size or scaling of MOSFET devices while maintaining performance characteristics.

The scaling of Metal-Oxide-Semiconductor Field-Effect Transistor (MOSFET) has reached sub-10 nm range. However, further reducing the transistor size is challenged by the power consumption. To address this, a smaller subthreshold swing (SS) is the key to reducing the supply voltage and the subthreshold leakage current. The SS of a MOSFET is generally a characterization of the amount of voltage necessary to change the current flow by a decade. A reduced supply voltage and a reduced subthreshold leakage current are essential for low power electronics.

The SS of conventional MOSFETs is fundamentally limited to a minimum of 60 mV/decade. However, there have been proposed devices that promise a subthreshold swing of less than 60 mV/decade. These are devices based on impact ionization, ferroelectric dielectrics, mechanical gates and band-to-band tunneling. Tunneling field effect transistors (TFETs) are particularly promising since they do not suffer from delays caused by positive feedback that is common in the other device concepts. However, despite many predictions of outstanding TFET performance and more than a decade of considerable research efforts worldwide, most experimental TFETs underperform conventional MOSFETs. TFETs with SS below 60 mV/decade and a sufficiently large ON current have not been demonstrated.

There is evidence that the TFET-typical switching mechanism by tuning the alignment of valence and conduction band is insufficient to maintain a sufficient ON current and low SS: Incoherent scattering mechanisms such as Auger recombination, electron scattering on phonons and impurities are supporting the band tail formation that eventually spoils a rapid switching behavior.

There exists a need, therefore, for an improvement to TFET performance that reduces the impact of the bandtail formation on the leakage current and increases the ON/OFF current density ratio significantly.

SUMMARY

At least some of the embodiments described herein address the above-stated need by introducing a TFET device that incorporates several more switching mechanisms.

A first embodiment disclosed herein is a tunnel field-effect transistor (TFET) that includes a fin, an insulator layer, and at least one gate. The fin has a doped first region, a doped second region, and an interior region between the first region and the second region. The interior region is undoped or is more lightly doped than the first region and the second region. At least the interior region of the fin formed as a type II superlattice, wherein materials of the superlattice alternate vertically. The insulator layer is formed around the interior region. The gate is formed on at least a portion of the insulator region. The insulator layer and the at least one gate are configured to generate an inhomogeneous electrostatic potential within the interior region.

The above-described features and advantages, as well as others, will become more readily apparent to those of ordinary skill in the art by reference to the following detailed description and accompanying drawings.

DETAILED DESCRIPTION

Figure 1:
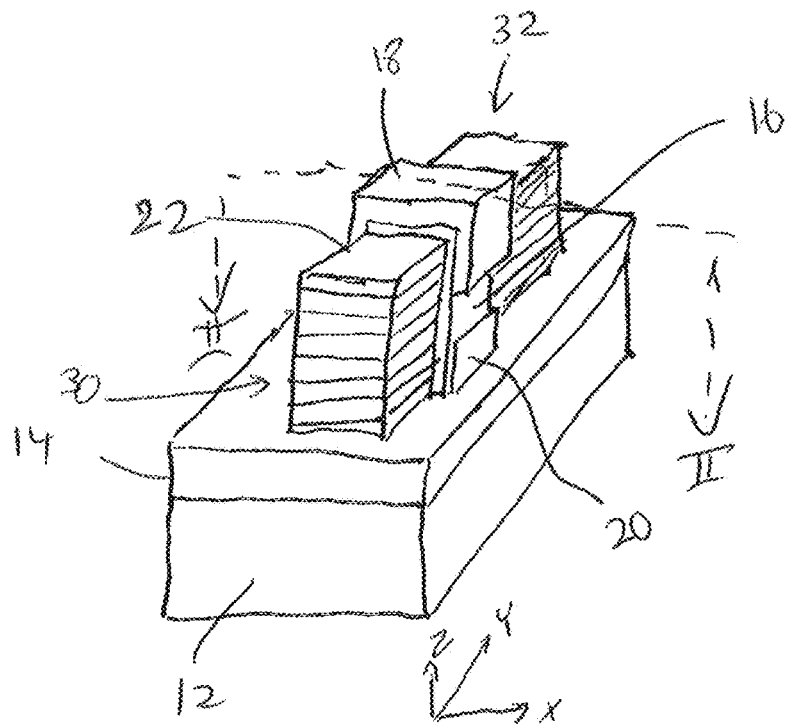
FIG. 1 shows a representative perspective view of a TFET according to a first embodiment.
Figure 2:
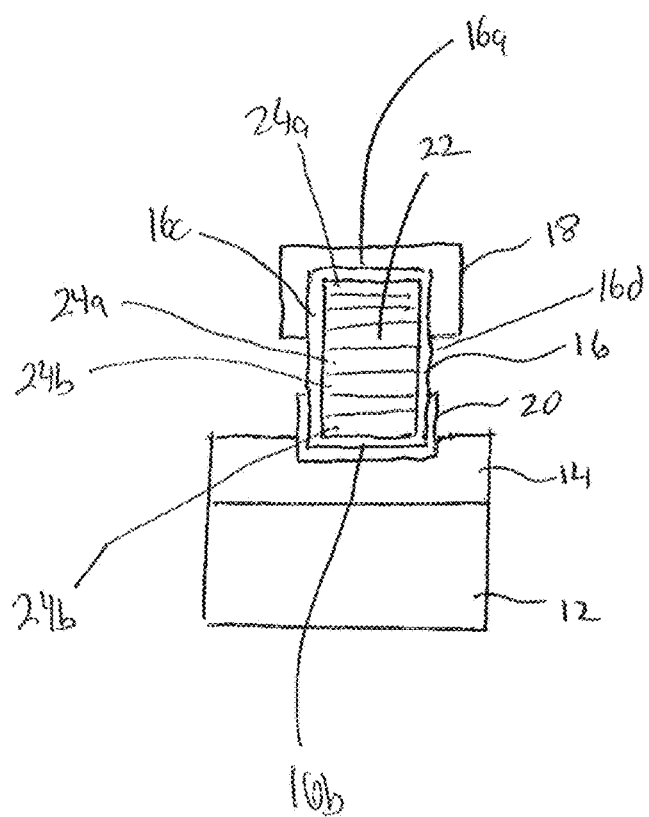
FIG. 2 shows a cross-sectional view of the TFET of FIG. 1.

FIG. 1 shows a perspective view of an exemplary embodiment of a cascade TFET 10 according to a first embodiment of the invention. FIG. 2 shows a cutaway view taken along line II-II of FIG. 1. It will be appreciated that the relative sizes of layers and regions may be exaggerated for clarity of exposition.

The cascade TFET 10 has some overlapping attributes with known fin TFET designs, such as that disclosed in U.S. Patent Application publication no. 2015/0340489, which is incorporated herein by reference. However, the TFET has substantial differences from prior art fin TFET and other TFET designs, as will be discussed below.

With simultaneous reference to FIGS. 1 and 2, the TFET 10 is disposed on a buried oxide layer 14, which in turn is disposed above a substrate 12. The TFET 10 includes a fin structure that is formed of a type II superlattice 22 having alternating layers 22a, 22b. The TFET 10 also includes an insulator or dielectric portion 16, a first gate 18 and a lower gate 20.

The alternating layers 22a, 22b of the superlattice 22 alternate in the vertical or z-direction, which is perpendicular the current flow direction or y-direction. The alternating layers 22a, 22b may be alternating layers of InAs and GaSb, InAs and AlSb, InAs and GaInSb, InAsSb and InSb, InAlN and GaN, AlGaAs and AlAs, AlGaAs and GaAs, or ZnSe and ZnTe. In other embodiments, the type II superlattice is formed from metal dichalcogenides, phosphorene, graphene, silicone, germanene, stanine, MoS2/MoTe2, SiGe/Si, metal oxide, type IV semiconductor material, type III/V semiconductor material, or type II/VI semiconductor material.

The fin superlattice 22 in the y-direction includes a first region 30, a second region 32 and an interior region 24 therebetween. In this embodiment, the first region 30 is N+ doped, and the second region 32 is P+ doped. The interior region 24 is undoped, or lightly doped in comparison the first region 30 and the second region 32. Each of the first region 30 and second region 32 may serve as a source or a drain of the TFET 10. The interior portion serves as the channel of the TFET 10. It will be appreciated that the TFET 10 will typically also include conductive source and drain contacts, not shown, but which are coupled to the first region 30 and second region 32.

The interior region 24 is surrounded by the dielectric spacer or insulator layer 16, in a manner not unlike a traditional fin FET. The dielectric spacer 16 has a top layer 16a that extends laterally across (in the x-direction) and adjacent to the top surface of the interior region 24, a bottom layer 16b that extends laterally across and adjacent to the bottom surface of the interior region 24, and sides 16c and 16d that extend down (in the z-direction) and adjacent to opposite sides of the interior region 24 of the superlattice fin 22. In this embodiment, the top layer 16a, bottom layer 16b and side layers 16c, 16d have uniform thicknesses. As will be discussed below, however, such thicknesses may be varied to achieve desired switching behavior in the TFET 10.

The first gate 18 and the second gate 20 may suitably be formed from metal or from a heavily doped semiconductor material. In this embodiment, the first gate 18 extends over the top layer 16a of the dielectric spacer 16, and the second gate 20 extends over a lower portion of the dielectric space 16. To this end, the first gate 18 is an-inverted U-shaped conductive element that extends laterally (in the x-direction) over and against the top layer 16a of the dielectric spacer 16 and partly down each side layer 16c, 16d of the dielectric spacer 16. Similarly, the second gate 20 is a U-shaped conductive element that extends laterally (in the x-direction) under and against the bottom layer 16b of the dielectric space 16 and partly up each side of the dielectric spacer 16.

For reasons that will be discussed below, the first gate 18 and the second gate 20 have different thicknesses, or at least are configured to provide a non-homogeneous electric field within the interior region 24.

In general, the TFET 10 operates to controllably allow current to flow from a drain to source depending on whether a voltage is applied to the first gate 18 and second gate 20. In an N-type TFET 10, the application of a gate voltage greater than a threshold ($V_G > V_{TH}$) to the first gate 18 and second gate 20 causes current to flow between the first region 30 (e.g. source) and the second region 32 (e.g. drain). When no gate voltage is present ($V_G=0$), then little or no current (e.g. leakage current) flows between the first region 30 and the second region 32. In a P-type TFET 10, then current flows in the absence of gate voltage ($V_G=0$) and little or no current flows when the gate voltage exceeds a threshold ($V_G > V_{TH}$).

Figure 3:
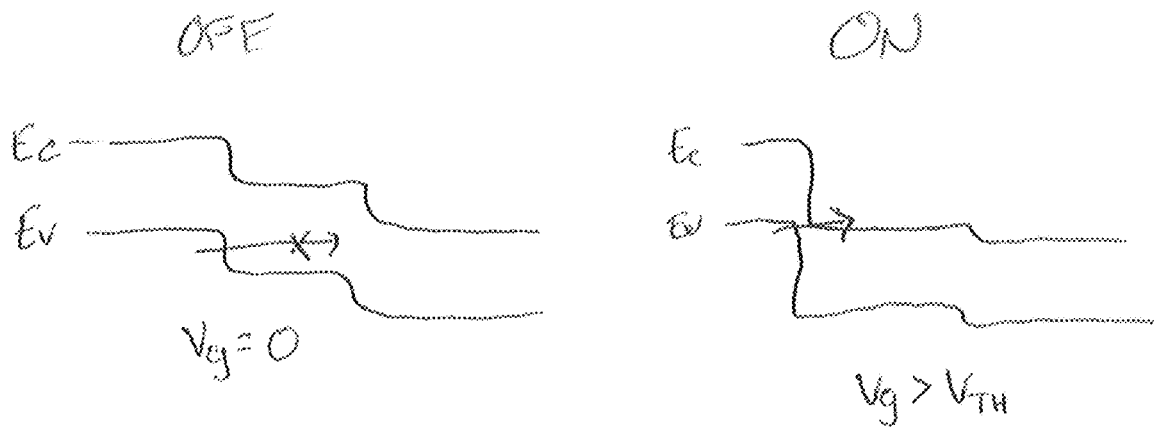
FIG. 3 shows a band structure profile of a typical TFET.

In a traditional TFET, the device geometry, the doping profile, the involved materials' bandgaps and the applied source drain voltage are chosen such that the conduction (EC) and valence band (EV) profile in the OFF state forms a 3-step structure as illustrated in FIG. 3. In the ON state, the EC and EV profiles shift as also shown in FIG. 3. The charts shown in FIG. 3 provide a frame of reference from which the operation of the embodiment of FIG. 1 may be discussed.

Specifically, the TFET 10 has similar operating characteristics as shown in FIG. 3, but has additional operational features as discussed herein. In general, the additional switching mechanisms described below in connection with FIGS. 4 and 5 augment the switching mechanism illustrated in FIG. 3. FIG. 3 shows that in the OFF state, $V_G=0$, the source side (region 30) is p-doped a nd holes of the source cannot tunnel into the interior region 24 under the gate 18, 20, since no target density of states is available. The only way they could conduct current would be if they tunnel through the total gate region into the n-doped drain area (region 32). Such a long distance tunneling is very unlikely and accordingly, the current in the OFF configuration is very low.

However, in the ON state, the applied gate voltage $V_G > V_{TH}$ shifts the band profile of the interior region 24 sufficiently to allow for holes of the source region to tunnel into the conduction band. As discussed above, the superlattice 22 and the corresponding gate structures 18, 20 provide additional switching mechanisms that improve the device SS, among other things. The tunneling distance is very low then, and high ON current can be maintained. Note that the described situation is mirrored for p-type TFETs.

The advantageous features of the TFET 10 arise from the fact that the TFET is inhomogeneous perpendicular to the transport direction, or in other words, the z-direction. As a result, the layered structure perpendicular to the current direction is confining electrons and holes of conduction and valence band into a type II superlattice as illustrated in FIG. 4.

Figure 4:
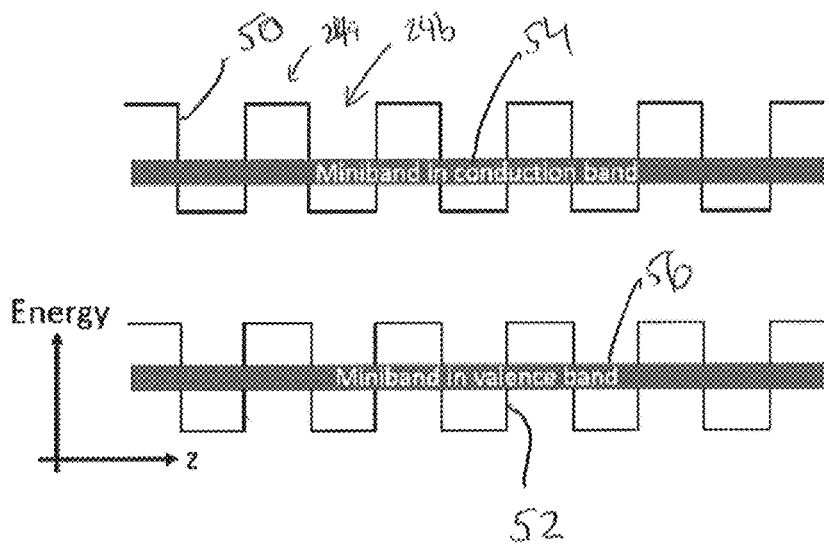
FIG. 4 shows a graph of the band structure profile of the TFET of FIG. 1 in the ON state.

In particular, FIG. 4 shows a graph of the band structure profile in the ON-state of the TFET 10. The alternating layers 24a, 24b of the TFET 10 have alternating band offsets which lead to the superlattice II typical alternating conduction band profile 50, and valence band profile 52. In this setting, the electronic states of conduction and valence band form minibands 54, 56, respectively, that are delocalized over the total extent of the TFET in z-direction.

As demonstrated by FIG. 4, the thicknesses of the individual layers 22a, 22b of the superlattice 22 define the confinement energies of the valence and conduction band states. The energy of these states determines which states are occupied and therefore contribute to the TFET 10 operation. In the ON state, the energies of all occupied electron states in the conduction band (similar for the hole states in the valence band) lie within an energy window of 25 meV, i.e. they are effectively degenerate within the thermal broadening at room temperature.

Other temperatures require different energy windows (following kBT). That allows them to form minibands in the conduction and valence band (see FIG. 4). Miniband states are delocalized across the total height of the superlattice fin 22 and correspondingly, the overlap between the valence and conduction band wave functions is large (see FIG. 4). In this situation, the tunneling between conduction and valence band is pronounced, due to the strong overlap of wave functions, due to the energy alignment as shown in FIG. 3, (similar to standard TFETs) and due to stronger pronounced bandtails (compared to nanowires) that are typical of ultra thin body (UTB) configurations. Note that bandtails significantly support tunneling between bands. Also, the density of states in UTB minibands is larger than in nanowires which further boosts the current density in this ON state.

Figure 5:
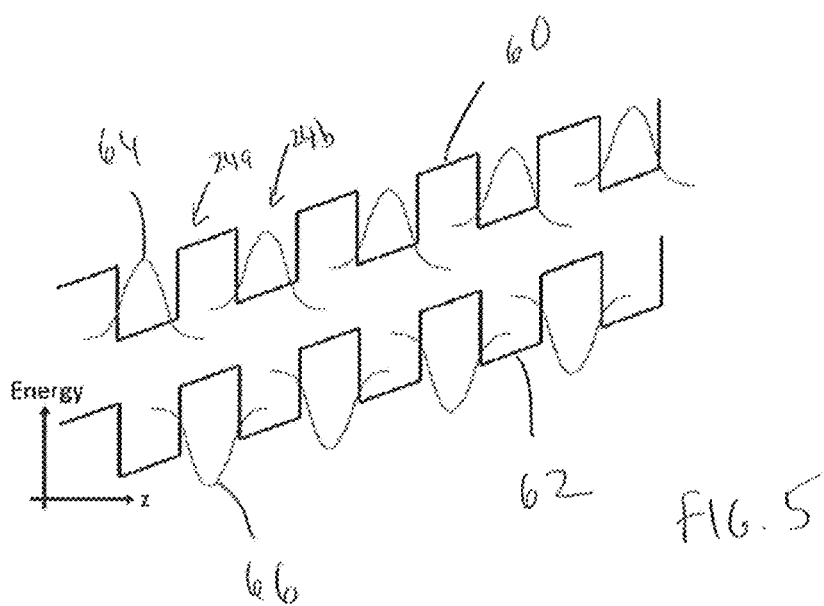
FIG. 5 shows a graph of the band structure profile of the TFET of FIG. 1 in the OFF state.

FIG. 5 shows the band structure profile in the OFF-state of the TFET 10. The alternating layers 24a, 24b of the TFET 10 have alternating band offsets which lead to the superlattice II typical alternating band profile (60, 62 in FIG. 5). In this setting, the superlattice structure faces a finite electric field in z-direction that adds to the material-given alternating conduction and valence band profiles. The electronic states of conduction and valence band are localized within individual layers In the OFF state, the energies of electron and hole like states 64, 66 in the conduction and valence band 60, 62, respectively are separated by more than 25 meV. Then the electrons and holes are confined in individual layers, as shown in FIG. 5.

Since the materials of these layers 24a, 24b are chosen to be a type II superlattice, the electron and hole wave functions are localized in distinct material layers. This results in a suppressed (OFF) source-drain current density: The small or negligible overlap of electron and hole wave functions makes a direct tunneling between the bands very unlikely. This small band-to-band tunneling probability is further reduced due to the fact the system is effectively a set of nanowires. In other words, the isolated layers 22a, 22b of the superlattice fin 22 (and specifically the interior region layers 24a, 24b) act like nanowires with a—compared to UTBs—reduced density of states and a reduced bandtails. The smaller density of states can cause offers less possible current density. The effective band gap of nanowire states is larger than that of the minibands in the UTB-like ON configuration thanks to the enhanced quantum mechanical confinement of nanowires. This again reduces the tunneling current in the OFF state of the TFET 10.

The switching between minibands (ON state of FIG. 4) and nanowire-like isolated layer states (OFF state of FIG. 5) is done with an applied electric field perpendicular to the transport direction, via gates 18, 20. This mechanism is frequently used in cascade devices, as discussed, for example, in Jirauschek, C. & Kubis, T. Modeling techniques for quantum cascade lasers. *Appl. Phys. Rev.* 1, (2014), and Bai, Y., Slivken, S., Kuboya, S., Darvish, S. R. & Razeghi, M. Quantum cascade lasers that emit more light than heat. *Nat. Photonics* 4, 99 (2010), both of which are incorporated herein by reference.

The respective energy shift of conduction and valence bands of individual layers depends on their relative position within that field in the z-direction. Depending on the desired switching configuration, i.e. whether the ON state is achieved with vanishing or with a finite gate field, the layers 24a, 24b have equal (for ON at 0 gate field) or different (for ON at finite gate field) thicknesses and accordingly equal or different confinement energies. In any case, whether the state energies are equal or different in the field free case, the inhomogeneous potential in the z-direction, caused by the configuration of the gate 18, 20 in this embodiment, allows to tune the states to either all match in energy (ON state) or to differ by more than the thermal broadening (OFF state). The conduction and valence minibands of the n-type and p-type materials have to be aligned in the ON state and misaligned in the OFF state to synchronize the cascade switching and the TFET switching and benefit from constructive interference of both effects.

Because the cascade-switching effect of the TFET occurs in the interior region 24 of superlattice fin 22, alternative embodiments may be implemented in which the source and/or drain is not a type II superlattice. The type II superlattice can extend to the doped source and drain regions or alternatively, the source and/or the drain region can consist of the respective homogeneous materials. Similarly, the extent of the doping regions can vary as well.

Figure 6:
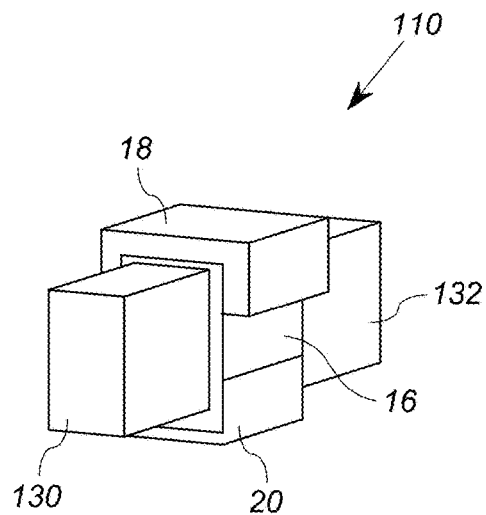
FIG. 6 shows a representative perspective view of a first alternative embodiment of the TFET of FIG. 1.

For example, FIG. 6 shows an alternative embodiment of a TFET 110 which is the same as the TFET 10 of FIG. 1, except that the first region 130 of the fin is homogenous material of a first doping type, and the second region 132 of the fin is homogenous material of a second doping type. Either or both of the first region 130 and second region 132 may be InAs, GaSb, AlSb, GaInSb, InAsSb, InSb, InAlN, GaN, AlGaAs, AlAs, GaAs, ZnSe, ZnTe, SiGe, Si, InAs/GaSb, InAs/AlSb, InAs/GaInSb, InAsSb/InSb, InAlN/GaN, AlGaAs/AlAs, AlGaAs/GaAs, ZnSe/ZnTe, metal dichalcogenides, phosphorene, graphene, silicone, metal oxide, type IV semiconductor material, type III/V semiconductor material, type II/VI semiconductor material, germanene, stanine, MoS2/MoTe2, or SiGe/Si. The interior region of the fin, not shown in FIG. 6, has the same superlattice structure as the interior region 24 of FIGS. 1 and 2.

Figure 7:
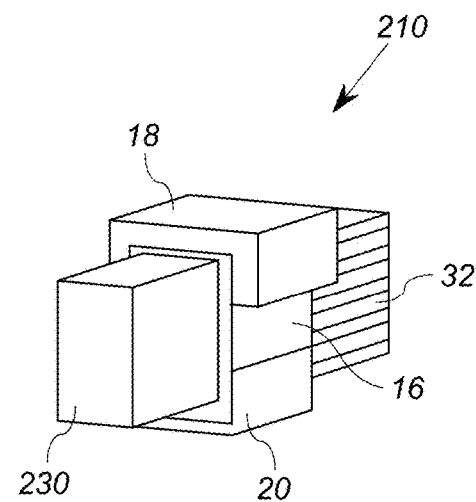
FIG. 7 shows a representative perspective view of a second alternative embodiment of the TFET of FIG. 1.
Figure 8:
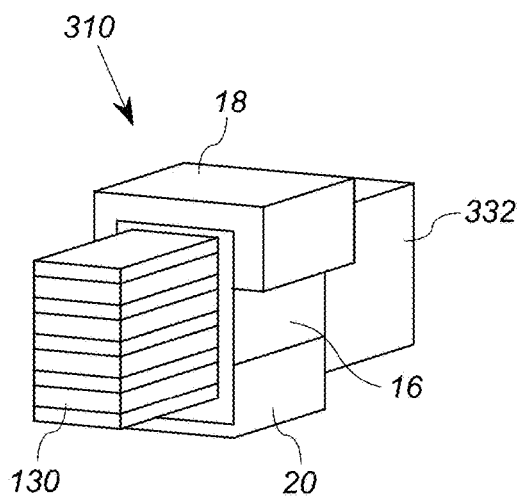
FIG. 8 shows a representative perspective view of a third alternative embodiment of the TFET of FIG. 1.
Figure 9:
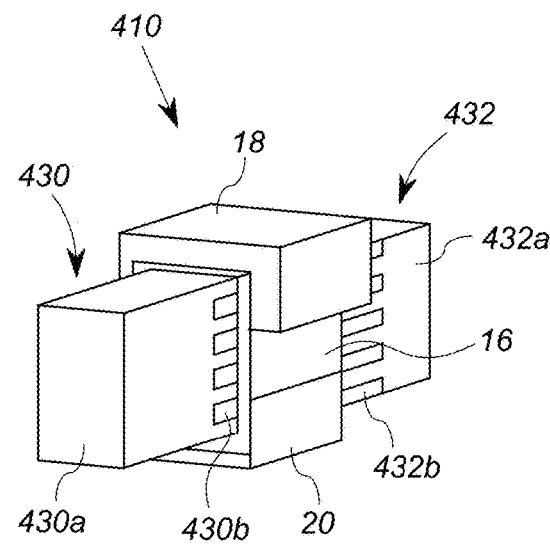
FIG. 9 shows a representative perspective view of a fifth alternative embodiment of the TFET of FIG. 1.

FIG. 7 shows an alternative embodiment of a TFET 210 which is the same as the TFET 10 of FIG. 1, except that the first region 230 of the fin is homogenous material of a first doping type. All of the other structures are the same as those of FIGS. 1 and 2. Similarly, FIG. 8 shows another alternative embodiment of a TFET 310 which is the same as the TFET 10 of FIG. 1, except that the second region 332 is homogenous material of the second doping type. FIG. 9 shows yet another alternative embodiment of a TFET 410 which is the same as the TFET 10 of FIG. 1, except that the first region 430 has an outer portion 430a that is a homogenous material of a first doping type and an inner portion 430b (between the outer portion 430a and the interior region 24) that is the same superlattice structure as the interior portion 24. (See FIG. 2). The second region portion 432 of the TFET 410 similarly has a homogeneous outer portion 432a and superlattice interior portion 432b.

Other possibilities exist. FIGS. 6 through 9 illustrate by example that the superlattice region may thus vary in size and position to customize the performance of the TFET 10. Similarly, the p-type and n-type doping can have a profile custom tuned for a required device performance.

Figure 10:
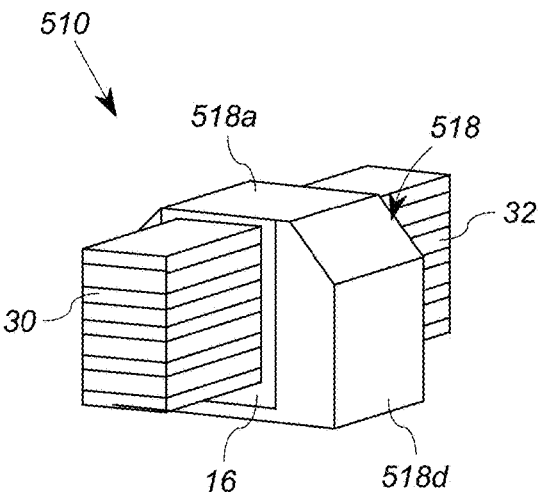
FIG. 10 shows a representative perspective view of a sixth alternative embodiment of the TFET of FIG. 1.

In still other embodiments, the gates 18, 20 and/or the insulator/dielectric 16 can be varies, so long as they impose an inhomogeneity in the electrostatic potential within the undoped region 24 under the gate 18, 20 (See FIG. 2) that switches between the profiles shown in FIGS. 4 and 5. In FIG. 1, the gate is formed of two gate segments 18, 20 having different (i.e. non-symmetrical) geometries. However, the inhomogeneity of the electrostatic potential may be effectuated using a single gate structure having an asymmetrical design and/or an dielectric layer having an asymmetrical design along the vertical dimension. By way of non-limiting example, FIG. 10 shows a device 510 that is the same as the TFET 10 except that the gate 518 is a single structure that surrounds the interior region 24 (not shown in FIG. 10) and has a vertically inhomogeneous shape. In this embodiment, the gate 518 has a thin top layer 518a, a thin bottom layer 518b, two thicker side layers (one not shown), 518d, and chamfered edges between the side layers 518d and the top layer 518.

Figure 11:
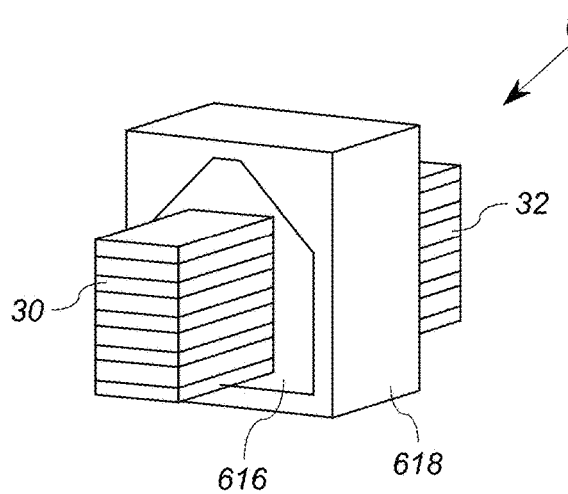
FIG. 11 shows a representative perspective view of a seventh alternative embodiment of the TFET of FIG. 1.

In another non-limiting example, FIG. 11 shows a TFET 610 that has the same structure as the TFET 10 of FIG. 1 except that both the insulation (dielectric) layer 616 and the gate 618 have a non-homogeneous shape. The insulation layer 616 has wider side and top portions, and chamfered corners between the sides and the top portions. The single piece gate 618 has an outer perimeter that is rectangular, and an inner perimeter that is conformal to the shape of the insulation layer 616. It will be appreciated that in the embodiments described herein, the gate structures are formed directly on the dielectric layers.

Figure 12:
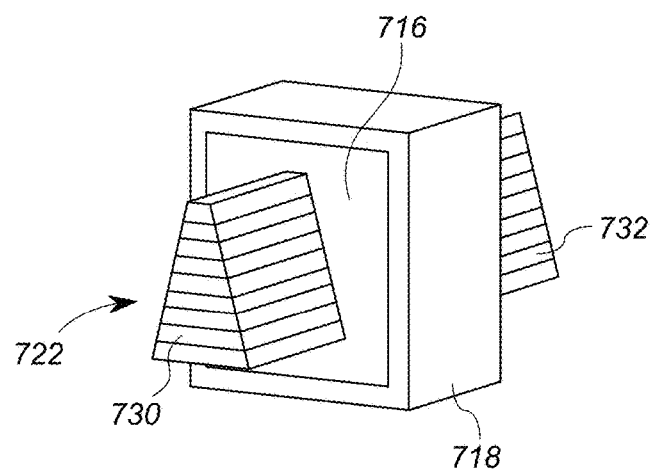
FIG. 12 shows a representative perspective view of an eighth alternative embodiment of the TFET of FIG. 1.

FIG. 12 shows yet a different embodiment of a TFET 710 which the shape of the fin 22 has been modified to have a trapezoidal shape, forming trapezoidal type II superlattice fin 722. The superlattice fin 722 has tapered sides in the first region 730, the second region 732, and the interior region, not shown, but which has the same shape and is disposed under the gate 718. The insulation layer 716 conforms to the trapezoidal shape of the fin 722, but has an external perimeter that is the same as the insulation layer 16 of FIG. 1. The remaining elements of the TFET 710 are similar to those of the TFET 10 of FIG. 1. Another way to vary the geometry of the superlattice itself can be to vary the thickness of the individual superlattice layers. Referring to FIG. 1, the thickness of layers 22a (or merely 24a) can differ from each other, and/or the thickness of layers 22b (or merely 24b) can differ from each other.

As discussed above, the type II superlattice fin 22 (or 722) can have alternating layers 22a, 22b of InAs/GaSb, InAs/AlSb, InAs/GaInSb, InAsSb/InSb, InAlN/GaN, AlGaAs/AlAs, AlGaAs/GaAs, ZnSe/ZnTe, SiGe/Si. In addition, alloys of these materials can serve the purpose of this technology as well. It will further be appreciated that 2D material superlattices of various growth orientations can potentially form type 2 superlattices. Known 2D materials are all transition metal dichalcogenides, phosphorene, graphene, silicene, germanene, and stanene. Varying their layer symmetry and thickness may allow to tune the bandstructures of heterojunctions to type 2 superlattices. Known examples are for type 2 band alignment are $MoS_2/MoTe_2$. Even homojunctions can form interlayer (type 2) excitons depending on the material details, as discussed in Wang, K.-C. et al. Control of interlayer physics in 2H transition metal dichalcogenides. J. Appl. Phys. 122, 224302 (2017).

The TFET 10 and other TFETs described herein may readily be fabricated using known standard transistor fabrication processes. To this end, all of layers of the TFET 10 are aligned with the growth direction (e.g. bottom up). In other words, each layer gets grown on top of the layers underneath. Areas where we want to have a specific material being grown will get defined with inverter masks.

The above-describe embodiments are merely exemplary. Those of ordinary skill in the art may readily devise their own modifications and implementations that incorporate the principles of the present invention and fall within the spirit and scope thereof.

The invention claimed is:

1. A tunnel field-effect transistor (TFET) comprising:
a fin have a doped first region, a doped second region, and an interior region between the first region and the second region, the interior region being undoped or more lightly doped than the first region and the second region, at least the interior region of the fin formed as a type II superlattice, wherein materials of the superlattice alternate vertically;
an insulator layer formed around the interior region;
at least one gate formed on at least a portion of the insulator region;
wherein the insulator layer and the at least one gate are configured to generate an inhomogeneous electrostatic potential within the interior region.

2. The TFET of claim 1, wherein the interior region is undoped.

3. The TFET of claim 1, wherein the superlattice comprises alternating layers of any of the following material pairs: InAs/GaSb, InAs/AlSb, InAs/GaInSb, InAsSb/InSb, InAlN/GaN, AlGaAs/AlAs, AlGaAs/GaAs, ZnSe/ZnTe.

4. The TFET of claim 1, wherein the superlattice includes any of the following materials: metal dichalcogenides, phosphorene, graphene, silicone, germanene, stanine, MoS2/MoTe2, SiGe/Si, metal oxide, type IV semiconductor material, type III/V semiconductor material, or type II/VI semiconductor material.

5. The TFET of claim 1, wherein the first gate and the second gate comprises a metal or a heavily doped semiconductor.

6. The TFET of claim 1, wherein the at least one gate comprises a first gate and a separate second gate, a top portion of the first gate extending over a top of the interior region, and a bottom portion of the second gate extending under the bottom of the interior region, wherein the top portion and the second portion have different thickenesses.

7. The TFET of claim 6, wherein an electrostatic potential gradient within the first gate and the second gate are configured to be substantially equal to zero.

8. The TFET of claim 1, wherein at least one of the first region and the second region are also formed from the type II superlattice.

9. The TFET of claim 8, wherein the first region is p-doped, and the second region is n-doped.

10. The TFET of claim 1, wherein the first region is p-doped, and the second region is n-doped.

11. The TFET of claim 1, wherein a top portion of the at least one gate has a greater thickness than a bottom portion of the at least one gate.

12. The TFET of claim 1, wherein the insulator layer has a substantially uniform thickness.

13. The TFET of claim 1, wherein the insulator layer has a varying thickness.

14. The TFET of claim 1, wherein all layers of the superlattice have the substantially the same width.

15. The TFET of claim 1, wherein layers of the superlattice portion have different widths to form a taper.

16. A tunnel field-effect transistor (TFET) comprising:
a fin have a doped first region, a doped second region, and an interior region between the first region and the second region, the interior region being undoped or more lightly doped than the first region and the second region, at least the interior region of the fin formed as a type II superlattice, wherein materials of the superlattice alternate vertically;
an insulator layer formed around the interior region;
at least one gate formed on at least a portion of the insulator region;
wherein the fin extends in a current direction from the first region to the second region and through the interior region, wherein the insulator layer and the at least one gate are configured to apply an electric field perpendicular to the current direction when voltage is applied to the at least one gate.

17. The TFET of claim 16, wherein the at least one gate comprises a first gate and a separate second gate, a top portion of the first gate extending over a top of the interior region, and a bottom portion of the second gate extending under the bottom of the interior region, wherein the top portion and the second portion have different thickenesses.

18. The TFET of claim 16, wherein at least one of the first region and the second region are also formed from the type II superlattice.

19. The TFET of claim 16, wherein the first region is p-doped, and the second region is n-doped.

20. The TFET of claim 16, wherein a top portion of the at least one gate has a greater thickness than a bottom portion of the at least one gate.

\* \* \* \* \*